United States Patent
Rode et al.

(10) Patent No.: US 8,482,106 B2
(45) Date of Patent: Jul. 9, 2013

(54) METHOD FOR PRODUCING CERAMIC PASSIVATION LAYERS ON SILICON FOR SOLAR CELL MANUFACTURE

(75) Inventors: Klaus Rode, Wiesbaden (DE); Hartmut Wiezer, Eppstein (DE)

(73) Assignee: AZ Electronic Materials (Luxembourg) S.A.R.L.

( * ) Notice: Subject to any disclaimer, the term of this patent is extended or adjusted under 35 U.S.C. 154(b) by 166 days.

(21) Appl. No.: 13/060,324

(22) PCT Filed: Aug. 26, 2009

(86) PCT No.: PCT/EP2009/006160
§ 371 (c)(1),
(2), (4) Date: Feb. 23, 2011

(87) PCT Pub. No.: WO2010/022916
PCT Pub. Date: Mar. 4, 2010

(65) Prior Publication Data
US 2011/0156221 A1   Jun. 30, 2011

(51) Int. Cl.
*H01L 23/58* (2006.01)

(52) U.S. Cl.
USPC ....... 257/632; 257/40; 257/E51.001; 438/958

(58) Field of Classification Search
USPC .................... 257/632, 40, E51.001; 438/958
See application file for complete search history.

(56) References Cited

U.S. PATENT DOCUMENTS

| | | | |
|---|---|---|---|
| 4,842,888 A * | 6/1989 | Haluska et al. | 428/688 |
| 6,338,868 B1 * | 1/2002 | Shibuya et al. | 427/10 |

* cited by examiner

*Primary Examiner* — Anthony Ho
(74) *Attorney, Agent, or Firm* — Sangya Jain

(57) ABSTRACT

The invention relates to a method for producing passivation layers on crystalline silicon by a) coating the silicon with a solution containing at least one polysilazane of the general formula (1): —(SiR'R"—NR'")-n, wherein R', R", R'" are the same or different and stand independently of each other for hydrogen or a possibly substituted alkyl, aryl, vinyl, or (trialkoxysilyl)alkyl group, wherein n is an integer and n is chosen such that the polysilazane has a number average molecular weight of 150 to 150,000 g/mol, b) subsequently removing the solvent by evaporation, whereby polysilazane layers of 50-500 nm thickness remain on the silicon wafer, and c) heating the polysilazane layer at normal pressure to 200-1000° C. in the presence of air or nitrogen, wherein upon tempering the ceramic layers release hydrogen for bulk passivation of the silicon.

9 Claims, No Drawings

METHOD FOR PRODUCING CERAMIC PASSIVATION LAYERS ON SILICON FOR SOLAR CELL MANUFACTURE

The present invention relates to a process for producing a passivation layer on crystalline silicon for the production of solar cells by transformation of a thin (10-200 nm) coating which contains perhydropolysilazanes (also referred to as PHPSs) or an organic polysilazane as main constituent and serves as hydrogen source for the volume passivation during the transformation. The transformation is carried out at temperatures of from 200 to 1000° C.

In view of the increasing scarcity of fossil energy sources, photovoltaics is of very great importance as alternative technology for the provision of energy. To achieve substantial and more rapid utilization of the technology, the production costs of photovoltaic modules have to be minimized. To reduce these costs, the efficiency of solar modules has to be increased and cheaper production technologies have to be developed.

An increase in the efficiency of industrially manufactured solar cells is achieved, inter alia, by suppression of electrical losses which very largely take place by recombination of charge carriers at defects in the silicon both in the volume and at the surfaces.

To passivate the surfaces, dielectric layers composed of thermally grown $SiO_2$ or PECVD-SiNx are applied. Application is effected on the n-conducting silicon layer and can additionally be effected on the p-conducting silicon layer (rear side passivation). It is known that hydrogen makes it possible to deactivate volume defects such as stretched bonds or charged defects and thus improve the electrical properties of solar cells. Industrially, the volume passivation of silicon solar cells is effected by diffusion from hydrogen-rich layers.

In the case of silicon nitride and silicon dioxide layers produced industrially in CVD processes, hydrogen is incorporated during deposition on the silicon surface. Apart from hydrogen, ammonia ($NH_3$) also serves as hydrogen source (64Widenborg, P. I., A. B. Sproul, and A. G. Aberle. Impurity and defect assivation in poly-Si films fabricated by aluminum-induced crystallisation. in Proc. 3rd WC PVSEC. 2003. Osaka.) When dissociated completely, $NH_3$ provides three hydrogen atoms per molecule instead of the two atoms of an $H_2$ molecule.

During heat treatment, i.e. heating of these layers to temperatures of >600° C., diffusion of the hydrogen from the layers into the silicon volume occurs. In the screen printing solar cell process, hydrogen diffusion through the hydrogen-containing layer on the Si surface takes place during firing of the contacts.

The disadvantages of applying passivation layers by CVD technologies are high costs for the complicated vacuum technique and the use of highly flammable ($SiH_4$, $CH_4$, $H_2$) and toxic ($NH_3$) gases.

The use of polysilazanes for the formation of $SiO_x$ and silicon nitride layers has been described.

JP 05243212 A describes polysilazane films having good covering properties and their use for coating semiconductor devices. Sintering and oxidation at relatively low temperatures results in formation of a passivation layer comprising a fine hygroscopic silicon oxide film.

The formation of antireflection coatings composed of polysilazane is likewise known.

Thus, JP-A-2005033063 describes polysilazane solutions which are applied to silicon single crystal substrates at normal temperatures by the spin coating method and are then fired at 600-800° C. in a nitrogen-containing atmosphere. In this way, it is possible to produce a low-reflection film having silicon nitride as main component on a solar cell.

It is therefore an object of the invention to provide a process for passivating crystalline silicon for solar cell production which allows expensive vacuum techniques to be circumvented and carry out a surface and volume passivation of silicon in a simple and economical way.

The present invention achieves the object and provides a process for passivating crystalline silicon by means of polysilazanes, by
a) coating a silicon wafer with a solution containing at least one polysilazane or a mixture of polysilazanes of the formula 1,

—(SiR'R''—NR''')n-  (1)

where R', R'', R''' are identical or different and are each, independently of one another, hydrogen or a substituted or unsubstituted alkyl, aryl, vinyl or (trialkoxysilyl)alkyl radical and n is an integer and n has such a value that the polysilazane has a number average molecular weight of from 150 to 150 000 g/mol,
b) subsequently removing the solvent by evaporation, resulting in polysilazane layers having a thickness of 50-500 nm remaining on the silicon wafer, and
c) heating the polysilazane layer to 200-1000° C. at atmospheric pressure in the presence of air or nitrogen, resulting in the ceramic layers liberating hydrogen during the heat treatment to effect volume passivation of the silicon.

In a preferred embodiment, the coating according to the invention contains at least one perhydropolysilazane (in which R', R'', R'''=H).

Polysilazanes in which R', R'', R''' are each, independently of one another, a radical from the group consisting of hydrogen, methyl, ethyl, propyl, isopropyl, butyl, isobutyl, tert-butyl, phenyl, tolyl, vinyl and 3-(triethoxysilyl)propyl, 3-(trimethoxysilylpropyl) are particularly useful here.

In a further preferred embodiment, the coating according to the invention contains polysilazanes of the formula (2),

—(SiR'R''—NR''')n-(SiR*R—NR*)p—  (2)

where R', R'', R''', R*, R and R* are each, independently of one another, hydrogen or a substituted or unsubstituted alkyl, aryl, vinyl or (trialkoxysilyl)alkyl radical and n and p have such values that the polysilazane has a number average molecular weight of from 150 to 150 000 g/mol.

Particular preference is given to compounds in which
R', R''' and R*** are each hydrogen and R'', R* and R** are each methyl;
R', R''' and R*** are each hydrogen and R'', R* are each methyl and R** is vinyl;
R', R''', R* and R* are each hydrogen and R'' and R are each methyl.
Preference is likewise given to using polysilazane of the formula (3)

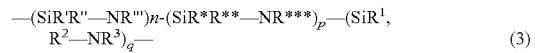

—(SiR'R''—NR''')n-(SiR*R—NR*)p—(SiR¹,
R²—NR³)q—  (3)

where R', R'', R''', R*, R, R*, $R^1$, $R^2$ and $R^3$ are each, independently of one another, hydrogen or a substituted or unsubstituted alkyl, aryl, vinyl or (trialkoxysilyl)alkyl radical and n, p and q have such values that the polysilazane has a number average molecular weight of from 150 to 150 000 g/mol.

Very particular preference is given to compounds in which R', R''' and R*** are each hydrogen and R'', R*, R** and $R^2$ are each methyl, $R^3$ is (triethoxysilyl)propyl and $R^1$ is alkyl or hydrogen.

In general, the proportion of polysilazane in the solvent is 1-80% by weight of polysilazane, preferably 2-50% by weight, particularly preferably 3-10% by weight.

Suitable solvents are, in particular, organic, preferably aprotic solvents which contain no water and also no reactive groups such as hydroxyl or amino groups and are inert toward the polysilazane. Examples are aromatic or aliphatic hydrocarbons and mixtures thereof.

The solvents can be, for example, aliphatic or aromatic hydrocarbons, halogenated hydrocarbons, esters such as ethyl acetate or butyl acetate, ketones such as acetone or methyl ethyl ketone, ethers such as tetrahydrofuran or dibutyl ether and also monoalkylene and polyalkylene glycol dialkyl ethers (glymes) or mixtures of these solvents.

Additional constituents of the polysilazane solution can be catalysts such as organic amines, acids or metals or metal salts or mixtures of these compounds which accelerate the layer formation process. The catalysts are preferably used in amounts of from 0.001 to 10%, in particular from 0.01 to 6%, particularly preferably from 0.1 to 3%, based on the weight of the polysilazane.

Further constituents can be additives for substrate wetting and film formation or inorganic nanoparticles such as $SiO_2$, $TiO_2$, ZnO, $ZrO_2$ or $Al_2O_3$.

The process of the invention makes it possible to produce an impervious, vitreous layer which owing to its freedom from cracks and pores and the high hydrogen content is excellent for passivation.

The layers produced preferably have a thickness of from 10 to 200 nm.

The layers produced have a hydrogen content at the beginning of ceramicization and this is driven from the layer with increasing ceramicization temperature.

The process of the invention makes it possible to drive the hydrogen from the amorphous polysilazane layer which has been applied in a first step over a period of from 0.1 to 30 minutes at temperatures of 200-1000° C. and convert the layer into a transparent ceramic phase. Depending on the ceramicization conditions, whether in air or a nitrogen-containing atmosphere, the ceramic phase formed has a different composition.

Thermal initiation of the transformation of the polysilazane framework in air results in the hydrogen passivation of the silicon substrate occurring with transformation into a transparent ceramic phase of the composition $$Si_uN_vH_wO_xC_y \qquad (4)$$

where u, v, w, x, y are atom % and, depending on the ceramicization temperature, phases of the composition in which x>v, where v<1 and x<1.3 and are not equal to zero, and w=2.5-0 and y<0.5, with u in each case being 1, are formed.

Thermal initiation of the transformation of the polysilazane framework in a nitrogen atmosphere results in the hydrogen passivation of the silicon substrate occurring with transformation into a transparent ceramic phase of the composition $$Si_uN_vH_wO_xC_y \qquad (4)$$

where u, v, w, x, y are atom % and, depending on the ceramicization temperature, phases of the composition in which v<1.3 and x<0.1 and also w=2.5-0 and y<0.2, with u in each case being 1, are formed.

The liberation of the passivating hydrogen can, according to the invention, occur in an air or nitrogen atmosphere in each case alone, in succession or alternatingly.

The heat input can be effected by means of a heatable furnace which is operated under nitrogen or air and can be regulated in the range 200-1000° C.

The coatings according to the invention are thus suitable not only for surface passivation but also for the hydrogen passivation of the silicon substrate. The process known hitherto from the prior art requires complicated vacuum methods for this purpose.

EXAMPLES

Coating Process

Spin Coating
Ceramicization:
Transformation of polysilazane into a ceramic of the formula (4) was carried out at 200-1000° C. in a furnace which can be operated under air or nitrogen.

The layer thicknesses formed are 10-200 nm.
Layer Thickness Measurements:
The measurements were carried out by means of ellipsometry.
Substrates:
p-type silicon: a 1 Ωcm FZ p-type silicon wafer having a thickness of 250 μm was used as substrate. After standard RCA cleaning, the various polysilazane layers were applied.
n-type silicon: the POCl emitter diffusion on an FZ silicon wafer having a thickness of 250 nm was carried out in a standard furnace and led to emitter layer resistances of 40 Ω/sqr.
Determination of the Volume Passivation:
The life was determined according to the principle of the decrease in photoconductivity (QSSPC) on a Sinton Apparatus model WCT-100. The greater the life, the better the passivation.
Determination of the Layer Composition:
The layer composition was determined on a polysilazane powder which had in each case been ceramicized under the same conditions as on the silicon.

TABLE 1

| Ex. | Wafer | Poly-silazane | Atmo-sphere | Temperature [° C.] | Time [min.] | Layer analysis | u | v | w | x | y | Layer thickness [nm] | Life [ms] |
|---|---|---|---|---|---|---|---|---|---|---|---|---|---|
| Ref. | p-type, 1 ohm cm | | | | | | | | | | | | 18 |
| 1 | p-type, 1 ohm cm | PHPS | air | 400 | 30 | SiuNvHwOx Cy | 1.0 | 0.3 | 0.8 | 0.8 | 0.1 | 15 | 65 |
| 2 | Ex. 1 after 400° C. | | | 800 | 30 | SiuNvHwOx Cy | 1.0 | 0.5 | 0.2 | 1.1 | <0.1 | | 83 |
| 3 | p-type, 1 ohm cm | PHPS | air | 400 | 30 | SiuNvHwOx Cy | 1.0 | 0.6 | 0.8 | 0.8 | 0.1 | 105 | 180 |
| 4 | p-type, 1 ohm cm | PHPS | nitrogen | 400 | 30 | SiuNvHwOx Cy | 1.0 | 0.9 | 1.4 | <0.1 | <0.1 | 75 | 920 |
| 5 | Ex. 4 after 400° C. | | | 800 | 30 | SiuNvHwOx Cy | 1.0 | 1.0 | 0.4 | <0.1 | <0.1 | | 1020 |
| 6 | n-type, 40 ohm cm² | PHPS | air | 400 | 30 | SiuNvHwOx Cy | 1.0 | 0.6 | 0.8 | 0.8 | 0.1 | 105 | 120 |
| 7 | Ex. 6 after 400° C. | | | 900 | 30 | SiuNvHwOx Cy | 1.0 | 1.1 | 0.1 | 1.1 | <0.1 | | 160 |

TABLE 1-continued

| Ex. | Wafer | Poly-silazane | Atmo-sphere | Temperature [° C.] | Time [min.] | Layer analysis | u | v | w | x | y | Layer thickness [nm] | Life [ms] |
|---|---|---|---|---|---|---|---|---|---|---|---|---|---|
| 8 | n-type, 40 ohm cm$^2$ | PHPS | nitrogen | 400 | 30 | SiuNvHwOxCy | 1.0 | 0.9 | 1.4 | <0.1 | <0.1 | 75 | 110 |
| 9 | p-type, 1 ohm cm$^2$ | ABSE | nitrogen | 900 | 30 | SiuNvHwOxCy | 1.0 | 0.9 | 0.1 | 0.2 | 1.5 | 75 | 53 |

The invention claimed is:

1. A process for producing a passivation layer on crystalline silicon comprising the steps of
   a) coating the silicon with a solution containing at least one polysilazane of the formula (1), $$-(SiR'R''-NR''')_n- \quad (1)$$

where R', R'', R''' are identical or different and are each, independently of one another, hydrogen or a substituted or unsubstituted alkyl, aryl, vinyl or (trialkoxysilyl)alkyl radical and n is an integer and n has such a value that the polysilazane has a number average molecular weight of from 150 to 150,000 g/mol,
   b) removing the solvent by evaporation, resulting in polysilazane layer having a thickness of 50-500 nm remaining on the silicon wafer, and
   c) heating the polysilazane layer to 200-1000° C. at atmospheric pressure in the presence of air or nitrogen, resulting in the ceramic layer liberating hydrogen during the heat treatment to effect volume passivation of the silicon.

2. The process as claimed in claim 1, wherein a ceramic Layer $$Si_uN_vH_wO_xC_y \quad (4)$$

wherein
u=1; v=1.3-0; w=3-0; x=1.3-0; Y=1.5-0,
is formed on the substrate and the ceramic layer serves as hydrogen diffusion source for volume passivation.

3. The process as claimed in claim 1, wherein the polysilazane solution contains at least one perhydropolysilazane wherein R', R'' and R'''=H.

4. The process as claimed in claim 1, wherein coating takes place in the presence of air and phases of the composition in which x>v, where v<1 and x<1.3 and are not equal to zero, and w=2.5-0 and y<0.5, with u in each case being 1, are formed.

5. The process as claimed in claim 1, wherein coating takes place in the presence of nitrogen and phases of the composition in which v<1.3 and x<0.1 and w=2.5-0 and y<0.2, with u in each case being 1, are formed.

6. The process as claimed in at claim 1, wherein the ceramic layer has a thickness in the range from 10 to 200 nm.

7. The process as claimed in claim 1, wherein the polysilazane solution contains a catalyst and optionally, further additives.

8. The process as claimed in claim 1, wherein the ceramic layer is applied to n-type silicon.

9. The process as claimed in claim 1, wherein the ceramic layer is applied to p-type silicon.

* * * * *